United States Patent [19]

Saxon

[11] 4,153,820
[45] May 8, 1979

[54] PAGING AMPLIFIER FOR A KEY TELEPHONE SYSTEM

[75] Inventor: Bruce R. Saxon, Harrisburg, Pa.

[73] Assignee: International Telephone & Telegraph Corporation, Nutley, N.J.

[21] Appl. No.: 853,001

[22] Filed: Nov. 18, 1977

[51] Int. Cl.² .......................... H04M 3/40; H03F 3/20
[52] U.S. Cl. .................................. 179/1 A; 179/99 P; 330/124 R; 330/276; 330/295
[58] Field of Search .............. 179/1 A, 81 B, 99, 1 H, 179/1 CN, 1 HF, 18 BF; 330/124 R, 165, 276, 295

[56] References Cited

U.S. PATENT DOCUMENTS

| | | | |
|---|---|---|---|
| 3,406,352 | 10/1968 | Gardenghi | 330/124 R |
| 3,471,796 | 10/1969 | Wright | 330/295 |
| 3,941,933 | 3/1976 | Shields | 179/1 H |
| 4,045,744 | 8/1977 | Sampei | 179/1 A |
| 4,061,984 | 12/1977 | Zirwas | 330/124 R |

Primary Examiner—Kathleen H. Claffy
Assistant Examiner—Randall P. Myers

Attorney, Agent, or Firm—John T. O'Halloran; Alfred C. Hill

[57] ABSTRACT

The amplifier includes an audio signal input means and a first pair of integrated circuit audio power amplifiers each having an inverting input and a non-inverting input. The inverting input of one of the first pair of amplifiers is coupled to the input means and the non-inverting input of the other of the first pair of amplifiers is coupled to the input means. A first load has one terminal coupled to the output of one of the first pair of amplifiers and the other terminal coupled to the output of the other of the first pair of amplifiers. A second pair of integrated circuit audio power amplifiers each having an inverting input and a non-inverting input. The inverting input of one of the second pair of amplifiers is coupled to the input means and the non-inverting input of the other of the second pair of amplifiers is coupled to the input means. A second load has one terminal coupled to the output of one of the second pair of amplifiers and the other terminal coupled to the output of the other of the second pair of amplifiers. The first and second loads provide positive and negative amplified audio output signals for the paging amplifier.

21 Claims, 1 Drawing Figure

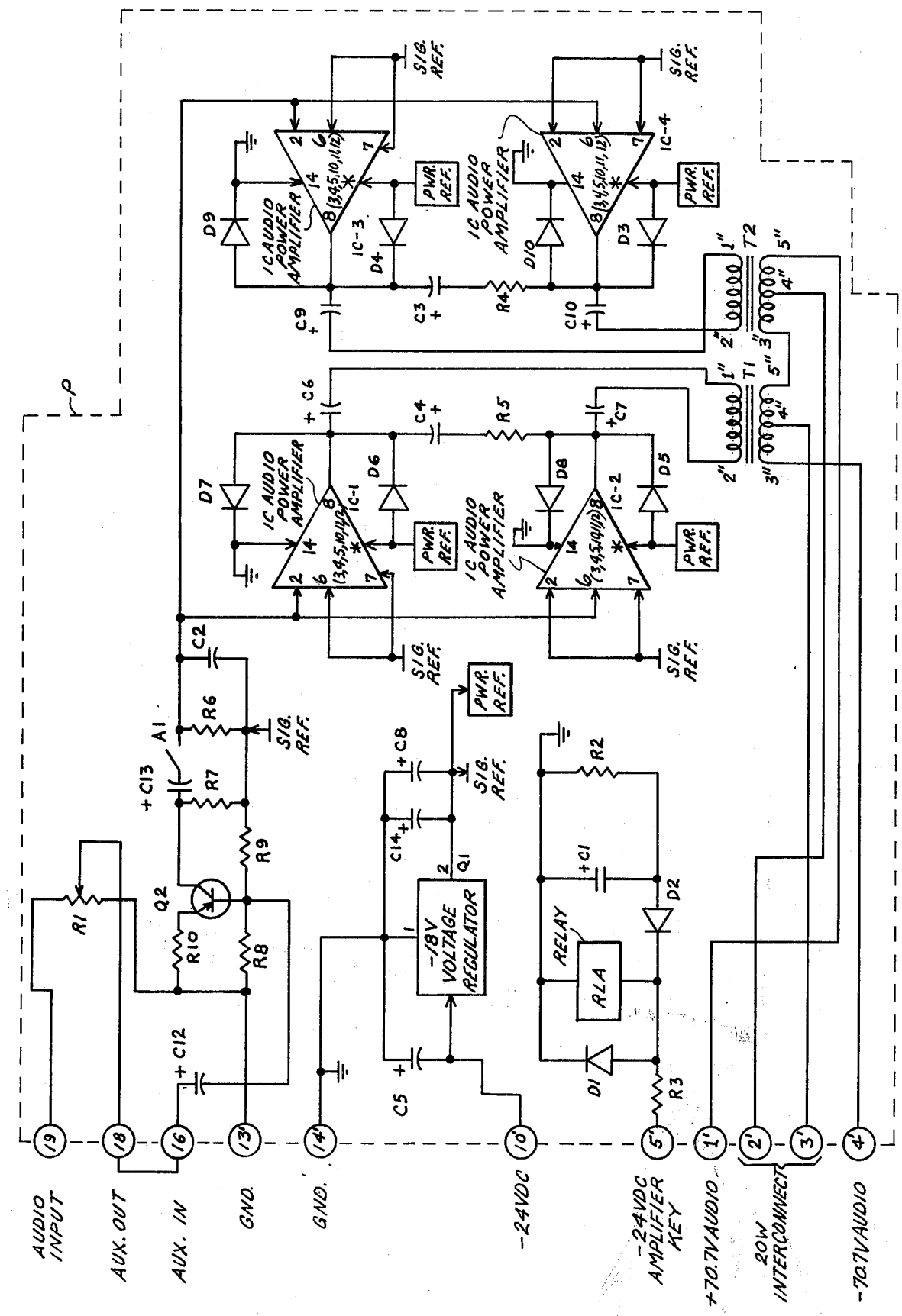

PAGING AMPLIFIER FOR A KEY TELEPHONE SYSTEM

BACKGROUND OF THE INVENTION

This invention relates to key telephone systems and more particularly to a paging amplifier employed in such systems.

Similar audio paging amplifiers that are used for key telephone systems employ either discrete component circuitry or some form of hybrid device. Some paging amplifiers employ built-in power sources. The paging amplifiers that are not self powered require an external power source, generally the available key telephone system power supply. Since these paging amplifiers are generally negative ground positive voltage circuits, and the key telephone system employs a positive ground negative voltage power supply, an input transformer is required to isolate the audio input signal's ground reference from the rest of the circuit.

Paging amplifiers with built-in power supplies are cost penalized compared with units that can derive their operating power from an existing key telephone system power supply. Paging amplifiers that employ input isolation transformers are sensitive to hum pickup, because of the high impedance low signal level requirements of such transformers. In addition, input transformers are generally expensive components. Many paging amplifiers provide insufficient or marginally adequate output short circuit protection, thereby decreasing reliability. Multiple operation of these prior art paging amplifiers for increased power is either impractical or technically questionable due to the parallel connection of the amplifier outputs.

SUMMARY OF THE INVENTION

An object of the present invention is to provide an integrated circuit (IC) ten watt audio amplifier which derives operating power from local key telephone system power supplies.

Another object of the present invention is to replace the usual input isolation transformer with a specially designed transistor circuit.

The benefits derived from the specially designed transistor circuit are the elimination of hum pickup and lower manufacturing cost. The integrated circuits employed in the paging amplifier of the present invention give two types of positive output protection for short circuit conditions. In addition, the amplifier has been specifically designed for multiple applications. Series connection of the outputs of the paging amplifier is employed rather than parallel connections of the outputs of paging amplifiers.

A feature of the present invention is the provision of a paging amplifier for a key telephone system having a system ground and a system negative voltage power supply comprising: audio signal input means; a first pair of audio power amplifiers each having an inverting input, a non-inverting input, at least one ground input, a power supply input and an output, the inverting input of one of the first pair of amplifiers being coupled to the input means and the non-inverting input of the other of the first pair of amplifiers being coupled to the input means; a first load having one terminal coupled to the output of one of the first pair of amplifiers and the other terminal coupled to the output of the other of the first pair of amplifiers; a second pair of audio power amplifiers each having an inverting input, a non-inverting input, at least one ground input, a power supply input and an output, the inverting input of one of the second pair of amplifiers being coupled to the input means and the non-inverting input of the other of the second pair of amplifiers being coupled to the input means; and a second load having one terminal coupled to the output of one of the second pair of amplifiers and the other terminal coupled to the output of the other of the second pair of amplifiers; the first and second loads providing positive and negative amplified audio output signals for the paging amplifier.

BRIEF DESCRIPTION OF THE DRAWING

Above-mentioned and other features and objects of this invention will become more apparent by reference to the following description taken in conjunction with the accompanying drawing, in which the single FIGURE of the drawing is a schematic partially block diagram of an audio paging amplifier for a key telephone system in accordance with the principles of the present invention.

DESCRIPTION OF THE PREFERRED EMBODIMENT

Referring to the FIGURE a negative power supply voltage ($-24$VDC) is connected to tab 10'. This voltage can have the minimal filtering and regulation generally obtained from a typical key telephone system "B" battery power supply section. This raw negative voltage is then regulated and filtered by a three terminal voltage regulator Q1. Regulator Q1 is commercially available from Motorola, Fairchild, Lambda and National Semiconductors. Additional filtering and RF (radio frequency) decoupling is provided by capacitors C5, C14 and C8. Although capacitors C8 and C14 are in parallel and could be replaced by one capacitor, capacitor C14 is placed close to regulator Q1 while capacitor C8 is placed close to the amplifying circuits in order to effectively protect against spurious oscillations. The output of regulator Q1 provides the negative reference for the small audio signal input SIG. REF. and a negative reference for power circuits of the amplifier PWR. REF. These negative references, although schematically identical, must be kept separated in order to avoid positive feedback effects from the voltage drops generated by the high currents from the power amplifier section flowing in a common return circuit with the small signal or input sections.

The power section is composed of four IC audio power amplifiers IC-1, IC-2, IC-3 and IC-4. These IC audio power amplifiers are commercially available from either National Semiconductors or Spraque. Each power amplifier circuit has an inverting input and a non-inverting input. Voltage gain is generally fixed by internal circuitry, although this is not an absolute requirement. The particular IC power amplifiers chosen contain both short circuit output protection and thermal limiting, which gives additional overall reliability. Each IC audio amplifier is a negative ground positive power supply unit. Thus, the negative output voltage from regulator Q1 is connected to the appropriate ground terminals of the IC power amplifiers. The * (asterisk) in each of the power amplifiers represents the IC ground pins 3, 4, 5, 10, 11 and 12. The key telephone system ground shown by the ground symbols is the positive power supply potential for the IC power amplifiers. The negative reference for the high current handling pins (ground pins) is kept separate from the negative input signal reference in order to avoid the positive feedback effects that produce oscillations and high harmonic and intermodulation distortion. Each pair of IC power amplifiers are arranged in a bridge configuration by using a common audio signal input coupled to the inverting input of one of the IC audio amplifiers of a pair and the non-inverting input of the other IC audio amplifier of a pair. The output is then bridged between the two IC audio amplifiers. All four IC audio amplifiers have a common audio input. Audio power amplifiers IC-1 and IC-2 form one of the bridged pair with the common input going to the non-inverting input of pin 2 of amplifier IC-1 and the inverting input pin 6 of amplifier IC-2. The bridged load is connected to the outputs at pin 8 of both IC amplifiers via D.C. blocking capacitors C6 and C7. The output load is formed by the primary winding (terminals 1" and 2") of transformer T1. Capacitor C4 plus resistor R5 form a RF filter in parallel with the load. Diodes D6 and D7 protect the output of amplifier IC-1 from high voltage transients that occur when the output transformer's secondary winding load is suddenly removed. Under these conditions, current which has been flowing through the load from the transformer's secondary winding is abruptly stopped which causes the inductive energy contained within the magnetic circuit to collapse, thereby generating a short time duration but high amplitude voltage pulse. This pulse is coupled to the primary winding as a lower voltage, but with still enough amplitude to destroy integrated circuits. Diode D7 shorts positive polarity transients directly to ground, while diode D6 shorts negative transients to ground via capacitors C8 and C14. In like manner, diodes D5 and D8 protect the output of the amplifier IC-2.

The second bridged pair is formed by audio power amplifiers IC-3 and IC-4. As before, the common input goes to the non-inverting input at pin 2 of amplifier IC-3 and the inverting input at pin 6 of amplifier IC-4. The output which is the primary winding of transformer T2 is bridged between pin 8 of amplifier IC-3 and pin 8 of amplifier IC-4 via D.C. blocking capacitors C9 and C10. Resistor R4 and capacitor C3 form a RF filter in parallel with the load (the primary winding of transformer T2). Diodes D4 and D9 protect the output of amplifier IC-3 against transients generated by interrupting transformer secondary winding loads. Diodes D3 and D10 protect the output of amplifier IC-4 against similar transients.

The amplifiers IC-1 and IC-2 bridged pair output goes to the primary winding of transformer T1 independent of the amplifiers IC-3 and IC-4 bridged pair output which goes to the primary winding of transformer T2. However, the secondary windings of these transformers are connected serially in phase. Each transformer steps the low voltage high current output of their respective IC power bridged amplifiers to a lower current higher voltage signal. The secondary winding of each transformer T1 and T2 produces five watts at 35.35 VRMS (volt root mean square). When the secondary windings of transformers T1 and T2 are added in series, the entire configuration produces ten watts of power at 70.7 VRMS. The 70.7 VRMS output is connected to tabs 1' and 4'. Transformers T1 and T2 have center taps that are connected to tabs 2' and 3'. These tabs produce ten watts of power at 35.35 VRMS. When serially connected in phase with tabs 2' and 3' of a second amplifier card, a total of twenty watts at 70.7 VRMS can be produced. The use of the two output transformers per plug-in printed circuit card P for the paging amplifiers of the present invention provides the opportunity for a greater total transformer lamination mass, thus improving low frequency performance.

The audio input signal at tab 19 is connected to the volume control potentiometer R1. The wiper of potentiometer R1 then goes to tab 18, instead of directly to the transistor amplifier stage Q2. The input of the amplifier stage Q2 is brought out to the auxiliary input at tab 16. The purpose of this configuration is to add in the operation of two amplifiers obtaining twenty watts output. The volume control on one printed circuit card can control both amplifiers by wiring tab 18 of one of the printed circuit cards to its own tab 16 and to tab 16 of the second printed circuit card. The second printed circuit card's potentiometer R1 is then out of the circuit and cannot influence the volume level. If only ten watts is required, then tab 18 is merely jumpered to tab 16 of the same printed circuit card.

Capacitor C12 provides D.C. blocking for the auxiliary input going to the base of transistor Q2. Resistors R8 and R9 set the base bias, resistor R10 is the emitter impedance and resistor R7 is the D.C. collector load. The collector of transistor Q2 is coupled via D.C. blocking capacitor C13 and relay contact A1 to its main A.C. load composed of resistor R6 and the common input to all four IC audio power amplifiers IC-1, IC-2, IC-3 and IC-4. Capacitor C2 quenches any tendency toward oscillation. The transistor Q2 amplifier stage produces power gain, but not voltage gain. Its primary purpose is to convert the ground reference of the incoming signal to a negative reference (output of regulator Q1) compatible with the signal reference used for the four IC audio power amplifier circuits. The configuration of transistor Q2 state with its high emitter degeneration and current gain transpose the ground reference of the input signal to the negative reference level SIG. REF. produced at the output of voltage regulator Q1. Activation of the audio power amplifiers IC-1, IC-2, IC-3 and IC-4 is accomplished by placing a −24VDC on the amplifier key function at tab 5'. Capacitor C1 begins to charge via diode D2 and resistor R3 to the −24VDC level. While charging, capacitor C1 reaches a voltage level that equals the pull-in value of relay RLA, thereby causing this relay to activate. This effectively provides a turn on delay for relay RLA. When relay RLA is activated, contact A1 is closed which connects the transistor Q2 stage output signal to the input of the audio power amplifiers IC-1, IC-2, IC-3 and IC-4.

When the amplifier key is removed, relay RLA is deactivated. The stored charge on capacitor C1 would have kept relay RLA operating, but diode D2 blocks this discharge path. Instead, capacitor C1 is discharged via a path provided by resistor R2. Diode D1 supresses inductive voltages generated when relay RLA deactivates.

While I have described above the principles of my invention in connection with specific apparatus it is to be clearly understood that this description is made only by way of example and not as a limitation to the scope of my invention as set forth in the objects thereof and in the accompanying claims.

I claim:

1. A paging amplifier for a key telephone system having a system ground and a system negative voltage power supply comprising:
    audio signal input means;

a first pair of audio power amplifiers each having an inverting input, a non-inverting input, at least one ground input, a power supply input and an output, said inverting input of one of said first pair of amplifiers being coupled to said input means and said non-inverting input of the other of said first pair of amplifiers being coupled to said input means;

a first load having one terminal coupled to said output of one of said first pair of amplifiers and the other terminal coupled to said output of the other of said first pair of amplifiers;

a second pair of audio power amplifiers each having an inverting input, a non-inverting input, at least one ground input, a power supply input and an output, said inverting input of one of said second pair of amplifiers being coupled to said input means and said non-inverting input of the other of said second pair of amplifiers being coupled to said input means; and a second load having one terminal coupled to said output of one of said second pair of amplifiers and the other terminal coupled to said output of the other of said second pair of amplifiers;

said first and second loads providing positive and negative amplified audio output signals for said paging amplifier.

2. A paging amplifier according to claim 1, wherein each amplifier of said first and second pairs of amplifiers is an integrated circuit audio power amplifier.

3. A paging amplifier according to claim 2, wherein said ground input of each amplifier of said first and second pairs of amplifiers is coupled to an input for said negative voltage power supply, and said power supply input of each amplifier of said first and second pairs of amplifiers is coupled to an input for said system ground.

4. A paging amplifier according to claim 3, further including a radio frequency filter coupled in parallel across each of said first and second loads.

5. A paging amplifier according to claim 4, wherein said input means includes an audio signal input, a transistor power amplifier coupled to said audio signal input, and a relay contact coupled to the output of said transistor power amplifier activated, after a time delay, by a relay responsive to a predetermined voltage to couple the output of said transistor power amplifier to said first and second pairs of amplifiers.

6. A paging amplifier according to claim 5, wherein said first load includes a first transformer having a primary winding coupled across said output of each amplifier of said first pair of amplifiers and a secondary winding; and said second load includes a second transformer having a primary winding coupled across said output of each amplifier of said second pair of amplifiers and a secondary winding;

one terminal of each secondary winding of said first and second transformer being coupled in series and the other terminal of each secondary winding of said first and second transformers providing said amplified audio output signals.

7. A paging amplifier to claim 6, wherein each of said radio frequency filters are coupled in parallel across the primary winding of an associated one of said first and second transformers.

8. A paging amplifier according to claim 1, wherein said ground input of each amplifier of said first and second pairs of amplifiers is coupled to an input for said negative voltage power supply, and said power supply input of each amplifier of said first and second pairs of amplifiers is coupled to an input for said system ground.

9. A paging amplifier according to claim 8, further including a radio frequency filter coupled in parallel across each of said first and second loads.

10. A paging amplifier according to claim 9, wherein said input means includes an audio signal input, a transistor power amplifier coupled to said audio signal input, and a relay contact coupled to the output of said transistor power amplifier activated, after a time delay, by a relay responsive to a predetermined voltage to couple the output of said transistor power amplifier to said first and second pairs of amplifiers.

11. A paging amplifier according to claim 10, wherein said first load includes a first transformer having a primary winding coupled across said output of each amplifier of said first pair of amplifiers and a secondary winding; and said second load includes a second transformer having a primary winding coupled across said output of each amplifier of said second pair of amplifiers and a secondary winding;

one terminal of each secondry winding of said first and second transformer being coupled in series and the other terminal of each secondary winding of said first and second transformers providing said amplified audio output signals.

12. A paging amplifier according to claim 11, wherein each of said radio frequency filters are coupled in parallel across the primary winding of an associated one of said first and second transformers.

13. A paging amplifier according to claim 1, further including a radio frequency filter coupled in parallel across each of said first and second loads.

14. A paging amplifier according to claim 13, wherein said input means includes an audio signal input, a transistor power amplifier coupled to said audio signal input, and a relay contact coupled to the output of said transistor power amplifier activated, after a time delay, by a relay responsive to a predetermined voltage to couple the output of said transistor power amplifier to said first and second pairs of amplifiers.

15. A paging amplifier according to claim 14, wherein said first load includes a first transformer having a primary winding coupled across said output of each amplifier of said first pair of amplifiers and a secondary winding; and said second load includes a second transformer having a primary winding coupled across said output of each amplifier of said second pair of amplifiers and a secondary winding;

one terminal of each secondary winding of said first and second transformer being coupled in series and the other terminal of each secondary winding of said first and second transformers providing said amplified audio output signals.

16. A paging amplifier according to claim 15, wherein each of said radio frequency filters are coupled in parallel across the primary winding of an associated one of said first and second transformers.

17. A paging amplifier according to claim 1, wherein said input means includes an audio signal input, a transistor power amplifier coupled to said audio signal input, and a relay contact coupled to the output of said transistor power amplifier activated, after a time delay, by a relay responsive to a predetermined voltage to couple the output of said transistor power amplifier to said first and second pairs of amplifiers.

18. A paging amplifier according to claim 17, wherein said first load includes a first transformer having a primary winding coupled across said output of each amplifier of said first pair of amplifiers and a secondary winding; and said second load includes a second transformer having a primary winding coupled across said output of each amplifier of said second pair of amplifiers and a secondary winding;

one terminal of each secondary winding of said first and second transformer being coupled in series and the other terminal of each secondary winding of said first and second transformers providing said amplified audio output signals.

19. A paging amplifier according to claim 18, further including a radio frequency filter coupled in parallel across the primary winding of each of said first and second transformers.

20. A paging amplifier according to claim 1, wherein said first load includes a first transformer having a primary winding coupled across said output of each amplifier of said first pair of amplifiers and a secondary winding; and said second load includes a second transformer having a primary winding coupled across said output of each amplifier of said second pair of amplifiers and a secondary winding;

one terminal of each secondary winding of said first and second transformer being coupled in series and the other terminal of each secondary winding of said first and second transformers providing said amplified audio output signals.

21. A paging amplifier according to claim 20, further including a radio frequency filter coupled in parallel across the primary winding of each of said first and second transformers.

* * * * *